(12) United States Patent
Zhao et al.

(10) Patent No.: US 11,764,568 B2
(45) Date of Patent: Sep. 19, 2023

(54) DIFFERENTIAL PROTECTION DETERMINATION METHOD

(71) Applicants: TAIZHOU POWER SUPPLY COMPANY OF STATE GRID ZHEJIANG ELECTRIC POWER, Zhejiang (CN); STATE GRID CORPORATION OF CHINA, Beijing (CN)

(72) Inventors: Ping Zhao, Zhejiang (CN); Chi Zhang, Zhejiang (CN); Yiping Shen, Zhejiang (CN); Yutao Qiu, Zhejiang (CN); Hua Xu, Zhejiang (CN); Xiaochun Xu, Jiangsu (CN); Hao Li, Zhejiang (CN); Yuande Zheng, Zhejiang (CN); Zaibing Zhou, Zhejiang (CN); Zhen Huang, Zhejiang (CN); Kang Wang, Zhejiang (CN); Jian Wu, Zhejiang (CN); Tao Zhu, Zhejiang (CN); Hao Tan, Jiangsu (CN); Ben Li, Jiangsu (CN); Qingchun Zhao, Jiangsu (CN); Xiaotong Zhu, Jiangsu (CN); Chen Zhou, Zhejiang (CN); Guode Ying, Zhejiang (CN); Zheng Qin, Zhejiang (CN); Xu Jiang, Zhejiang (CN)

(73) Assignees: TAIZHOU POWER SUPPLY COMPANY OF STATE GRID ZHEJIANG ELECTRIC POWER, Zhejiang (CN); STATE GRID CORPORATION OF CHINA, Beijing (CN)

( * ) Notice: Subject to any disclaimer, the term of this patent is extended or adjusted under 35 U.S.C. 154(b) by 545 days.

(21) Appl. No.: 16/761,022

(22) PCT Filed: Dec. 27, 2018

(86) PCT No.: PCT/CN2018/124261
§ 371 (c)(1),
(2) Date: Jul. 8, 2021

(87) PCT Pub. No.: WO2019/105486
PCT Pub. Date: Jun. 6, 2019

(65) Prior Publication Data
US 2021/0344190 A1    Nov. 4, 2021

(30) Foreign Application Priority Data
Nov. 28, 2017   (CN) .................... 201711216771.4

(51) Int. Cl.
G01R 31/08      (2020.01)
H02H 7/045     (2006.01)
H02H 7/26       (2006.01)

(52) U.S. Cl.
CPC .......... *H02H 7/045* (2013.01); *G01R 31/085* (2013.01); *H02H 7/263* (2013.01)

(58) Field of Classification Search
CPC .......... H02H 7/045; H02H 7/263; H02H 7/26; G01R 31/085
See application file for complete search history.

(56) References Cited

U.S. PATENT DOCUMENTS

| 6,148,267 | A | * | 11/2000 | Premerlani | ............ | H02H 3/302 |
| | | | | | | 702/58 |
| 2014/0063669 | A1 | * | 3/2014 | Lundqvist | ................ | H02H 3/30 |
| | | | | | | 361/79 |

FOREIGN PATENT DOCUMENTS

| CN | 101237143 A | 8/2008 |
| CN | 101877676 A | 11/2010 |

(Continued)

OTHER PUBLICATIONS

International Search Report and Written Opinion from PCT Application No. PCT/CN2018/124261 dated Apr. 8, 2019.

(Continued)

*Primary Examiner* — Adolf D Berhane
*Assistant Examiner* — Afework S Demisse
(74) *Attorney, Agent, or Firm* — Burns & Levinson, LLP; Joseph M. Maraia (57) ABSTRACT

Provided is a determination method of differential protection suitable for an electricity transmission line with multi- (Continued)

terminal T-connection. The determination method includes: sampling and calculating all phase currents, and calculating a maximum fault component current $\Delta \dot{I}_{max}$ in phase current amplitudes of each phase current, a differential current $I_{cd}$ in the each phase current, a resistive current $I_{res}$ in the each phase current and a vector sum $\Delta \dot{I}_\Sigma$ of fault component currents except $\Delta \dot{I}_{max}$ in the phase current amplitudes of the each phase current; and comparing the maximum fault component current $\Delta \dot{I}_{max}$ in phase current amplitudes of each phase current and a threshold setting value $I_{max0}$, determining a value of a resistive coefficient K corresponding to the phase current amplitudes of the each phase current according to a comparison result, and performing differential determination on the differential current $I_{cd}$ and the resistive current $I_{res}$ in phase current amplitudes of the each phase current according to a differential determination formula: if the differential current $I_{cd}$ of the target phase satisfies the above differential determination formula, it is determined that a fault occurs in an area of the target phase.

5 Claims, 2 Drawing Sheets

(56) References Cited

FOREIGN PATENT DOCUMENTS

| | | |
|---|---|---|
| CN | 103560482 A | 2/2014 |
| CN | 105896489 A | 8/2016 |
| CN | 106711963 A | 5/2017 |
| CN | 108023338 A | 5/2018 |
| WO | 2005078886 A1 | 8/2005 |
| WO | 2015/139719 A1 | 9/2015 |

OTHER PUBLICATIONS

Zhao et al., "A new current differential relay scheme for multi "T" nodes transmission line," Power System Protection and Control, vol. 45, No. 20, Oct. 16, 2017.

Office Action from Chinese Application No. 201711216771.4 dated Oct. 29, 2018.

\* cited by examiner

DIFFERENTIAL PROTECTION DETERMINATION METHOD

CROSS-REFERENCE TO RELATED APPLICATIONS

This is a National Stage Application, filed under 35 U.S.C. 371, of International Patent Application No. PCT/CN2018/124261, filed on Dec. 27, 2018, which claims priority to Chinese patent application No. 201711216771.4 filed on Nov. 28, 2017, contents of both of which are incorporated herein by reference in their entireties.

TECHNICAL FIELD

The present application belongs to a technical field of relay protection and, for example, to a determination method of differential protection.

BACKGROUND

In recent years, as a large amount of wind power is introduced into a grid, the electricity transmission line with the multi-terminal T-connection is increasingly applied to high-voltage electricity transmission lines for the sake of saving equipment investment, reducing land acquisition area and the like. The characteristic of the multi-node T-shaped wiring manner is that different nodes are "T" connected to the same line for combination to the grid. Therefore, the line for combination to the grid is important and has high requirements on reliability and sensitivity of protection. In the multi-node T-shaped wiring manner, a fault at any terminal will affect the normal power supply at the other terminals, so it is required to remove the faulty terminal quickly in case of fault. Due to the special property of the electricity transmission line with multi-terminal T-connection, it is difficult for distance protection and zero sequence protection to meet the requirements of speed mobility and selectivity. Because of the simple principle of the current differential protection, the current differential protection is hardly affected by many factors such as disconnection of a voltage transformer, series compensation, multiple parallel electricity transmission lines on the same tower, and is widely applied to double-terminal and three-terminal high-voltage electricity transmission lines.

A method suitable for determination of multi-terminal differential protection has been provided in the related art. In this method, the resistive coefficient K in the method for calculating a resistive current $I_{res}$ is still set to be a fixed resistive coefficient, and the sensitivity within an area of the electricity transmission line with multi-terminal T-connection and the reliability of the resistive characteristic outside the area cannot be improved at the same time.

SUMMARY

The following is a summary of the subject matter described herein in detail. This summary is not intended to limit the scope of the claims.

Embodiments of the present application provide a determination method of differential protection. The method is suitable for an electricity transmission line with multi-terminal T-connection. The method can automatically select a value of a resistive coefficient K according to the fault condition, thereby improving the sensitivity in an area of the electricity transmission line with multi-terminal T-connection and improving the reliability of the resistive characteristic outside the area at the same time.

The present application provides a determination method of differential protection. The method is suitable for an electricity transmission line with multi-terminal T-connection. The electricity transmission line with multi-terminal T-connection includes a host protection apparatus and a slave protection apparatus. The host protection apparatus is connected to a terminal of the electricity transmission line with multi-terminal T-connection, and the slave protection apparatus is connected to remaining terminals of the electricity transmission line with multi-terminal T-connection. The determination method includes steps 1 to 5. The step 1 is to respectively sample a plurality of phase currents of the host protection apparatus and a plurality of phase currents of the slave protection apparatus, and transmit a plurality of phase current amplitudes sampled from the plurality of phase currents of the slave protection apparatus to the host protection apparatus. The step 2 is to calculate, by the host protection apparatus, all phase current amplitudes sampled from the plurality of phase currents of the slave protection apparatus and the plurality of phase currents of the host protection apparatus, obtain a maximum fault component current $\Delta\dot{I}_{max}$ in a plurality of phase current amplitudes of each phase current of all phase currents, and calculating a differential current $I_{cd}$ in the each phase current, a resistive current $I_{res}$ in the each phase current and a vector sum $\Delta\dot{I}_\Sigma$ of one or more fault component currents except the maximum fault component current $\Delta\dot{I}_{max}$ in the phase current amplitudes of the each phase current. The step 3 is to select a plurality of target phase current amplitudes from all sampled phase current amplitudes, and in response to determining that the maximum fault component current $\Delta\dot{I}_{max}$ in the target phase current amplitudes is greater than a set threshold value $I_{max0}$, determine a target phase angle difference $\theta_1$ between a phase angle of the maximum fault component current $\Delta\dot{I}_{max}$ in the target phase current amplitudes and a phase angle of the vector sum $\Delta\dot{I}_\Sigma$ of the fault component currents except the maximum fault component current $\Delta\dot{I}_{max}$ in the target phase current amplitudes, where the target phase angle difference $\theta_1$ is used for assignment of a resistive coefficient K, and determine a set value $K_\theta$ of the resistive coefficient K according to an undetermined phase angle difference $\theta$, or in response to determining that the maximum fault component current $\Delta\dot{I}_{max}$ in the target phase current amplitudes is less than or equal to the threshold set value $I_{max0}$, determine a fixed value $K_{set}$ of the resistive coefficient K. The step 4 is to perform processing of step 3 on the phase current amplitudes of the each phase current of all phase currents, to obtain a value of the resistive coefficient K corresponding to the phase current amplitudes of the each phase current. The step 5 is to perform differential determination according to the differential current $I_{cd}$ in each phase current, the resistive current $I_{res}$ in the each phase current and the value of the resistive coefficient K corresponding to the phase current amplitudes of the each phase current obtained in step 4 and using a following differential determination formula:

$$\begin{cases} I_{cd} > I_{set} \\ I_{cd} > KI_{res} \end{cases}.$$

In the above formula, $I_{set}$ is a setting current value; and in response to determining that the differential current $I_{cd}$ of the target phase satisfies the differential determination formula, a fault is determined to occur in an area of the target phase.

Other aspects can be understood after the drawings and the detailed description are read and understood.

BRIEF DESCRIPTION OF DRAWINGS

To illustrate the technical solutions in the embodiments of the present application more clearly, the drawings used in the embodiments will be described below. The drawings in the following description are merely some embodiments of the present application, and other drawings may be obtained by those skilled in the art based on these drawings.

DETAILED DESCRIPTION

The structure of the present application will be described below in further detail with reference to the drawings.

Figure 1:
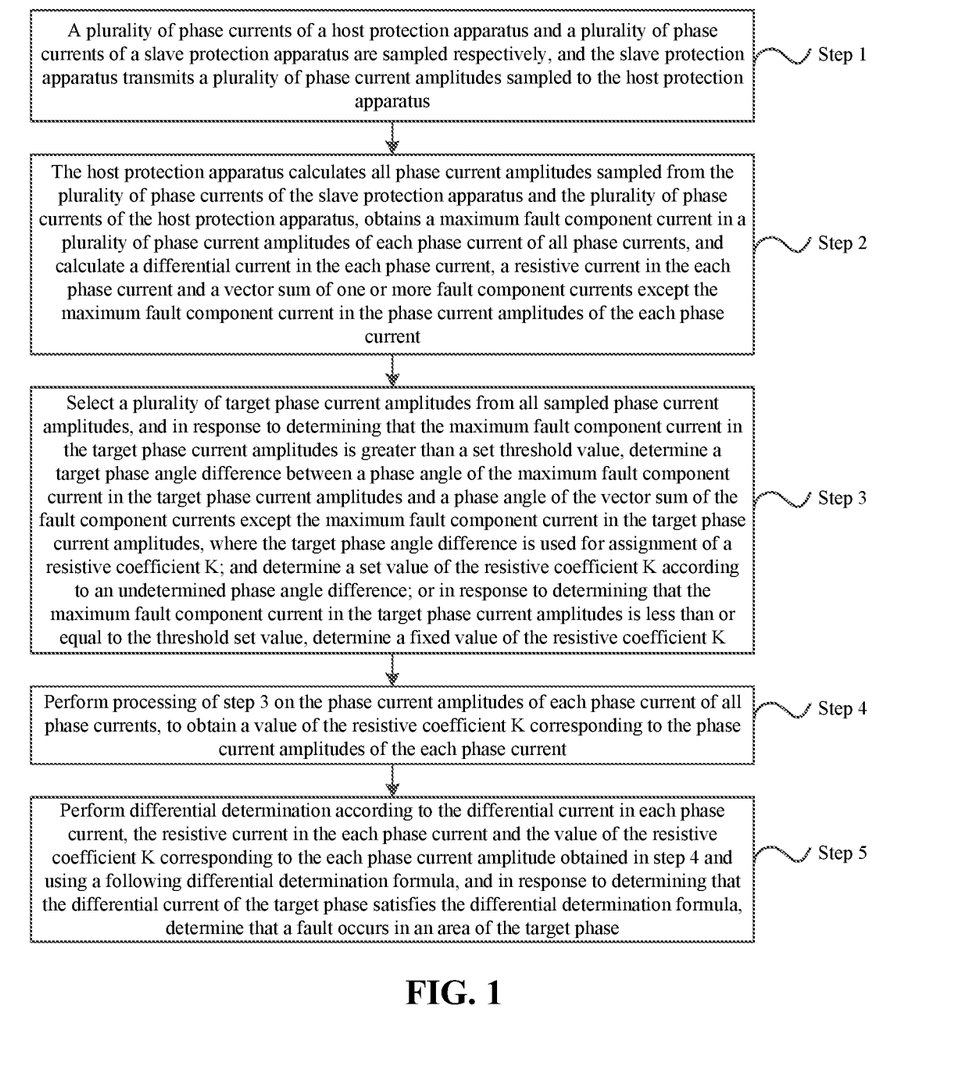
FIG. 1 is a flowchart of a determination method of differential protection according to the present application.

The present application provides a determination method of differential protection which is suitable for an electricity transmission line with multi-terminal T-connection. A terminal in the electricity transmission line with multi-terminal T-connection is determined as a host protection apparatus, and the remaining terminals as slave protection apparatuses. As shown in FIG. 1, the determination method includes steps 1 to 5.

In step 1, a plurality of phase currents of the host protection apparatus and a plurality of phase currents of the slave protection apparatus are sampled, and a plurality of phase current amplitudes sampled from the plurality of phase currents of the slave protection apparatus are transmitted to the host protection apparatus.

In step 2, the host protection apparatus calculates all phase current amplitudes sampled from the plurality of phase currents of the slave protection apparatus and the plurality of phase currents of the host protection apparatus, obtains a maximum fault component current $\Delta \dot{I}_{max}$ in a plurality of phase current amplitudes of each phase current of all phase currents, and calculates a differential current $I_{cd}$ in the each phase current, a resistive current $I_{res}$ in the each phase current and a vector sum $\Delta \dot{I}_\Sigma$ of one or more fault component currents except the maximum fault component current $\Delta \dot{I}_{max}$ in the phase current amplitudes of the each phase current.

In step 3, a plurality of target phase current amplitudes are selected from all sampled phase current amplitudes, and in response to determining that the maximum fault component current $\Delta \dot{I}_{max}$ in the target phase current amplitudes is greater than a set threshold value $I_{max0}$, a target phase angle difference $\theta_1$ between a phase angle of the maximum fault component current $\Delta \dot{I}_{max}$ in the target phase current amplitudes and a phase angle of the vector sum $\Delta \dot{I}_\Sigma$ of the fault component currents except the maximum fault component current $\Delta \dot{I}_{max}$ in the target phase current amplitudes is determined, where the target phase angle difference $\theta_1$ is used for assignment of a resistive coefficient K; and a set value $K_\theta$ of the resistive coefficient K is determined according to an undetermined phase angle difference $\theta$, or in response to determining that the maximum fault component current $\Delta \dot{I}_{max}$ in the target phase current amplitudes is less than or equal to the threshold set value $I_{max0}$, a fixed value $K_{set}$ of the resistive coefficient K is determined.

In step 4, processing of step 3 is performed on the phase current amplitudes of the each phase current of all phase currents, to obtain a value of the resistive coefficient K corresponding to the phase current amplitudes of the each phase current.

In step 5, differential determination is performed according to the differential current $I_{cd}$ in each phase current, the resistive current $I_{res}$ in the each phase current and the value of the resistive coefficient K corresponding to corresponding to the phase current amplitudes of the each phase current obtained in step 4 and using a following differential determination formula:

$$\begin{cases} I_{cd} > I_{set} \\ I_{cd} > K I_{res} \end{cases}.$$

In the above formula, $I_{set}$ is a setting current value, and in response to determining that the differential current $I_{cd}$ of the target phase satisfies the differential determination formula, a fault is determined to occur in an area of the target phase.

The setting current value is a parameter set in a differential protection apparatus. That is, when a differential current is greater than a preset setting current value, a differential protection mode is entered.

In implementation, first, a plurality of phase currents of the host protection apparatus and a plurality of phase currents of the slave protection apparatus on the electricity transmission line with multi-terminal T-connection; and then, in order to obtain a value of a resistive coefficient K, according to all phase current amplitudes sampled from the plurality of phase currents of the slave protection apparatus and the plurality of phase currents of the host protection apparatus by the host protection apparatus, a maximum fault component current $\Delta \dot{I}_{max}$ in a plurality of phase current amplitudes of each phase current and a vector sum $\Delta \dot{I}_\Sigma$ of fault component currents except the maximum fault component current $\Delta \dot{I}_{max}$ in the phase current amplitudes of the each phase current are calculated, and in order to determine whether a fault exists in an area of all phases according to a differential current $I_{cd}$ in the each phase current and a resistive current $I_{res}$ in the each phase current, the differential current $I_{cd}$ in the each phase current and the resistive current $I_{res}$ in the each phase current are calculated according to all phase current amplitudes sampled from the plurality of phase currents of the slave protection apparatus and the plurality of phase currents of the host protection apparatus by the host protection apparatus.

Then, a value of the resistive coefficient K is selected automatically according to a fault condition of each phase, thereby improving the sensitivity in an area of all phases and improving the reliability of the resistive characteristic outside the area at the same time. A plurality of target phase current amplitudes is selected from all sampled phase current amplitudes. If the maximum fault component current $\Delta \dot{I}_{max}$ in the target phase current amplitudes is greater than a set threshold value $I_{max0}$, a target phase angle difference $\theta_1$ between a phase angle of the maximum fault component current $\Delta \dot{I}_{max}$ in the target phase current amplitudes and a phase angle of the vector sum $\Delta \dot{I}_\Sigma$ of the fault component currents except the maximum fault component current $\Delta \dot{I}_{max}$ in the target phase current amplitudes is determined, where the target phase angle difference $\theta_1$ is used for assignment of a resistive coefficient K; and a set value $K_\theta$ of the resistive coefficient K is determined according to an undetermined phase angle difference $\theta$. Otherwise, if the maximum fault component current $\Delta \dot{I}_{max}$ in the target phase current amplitudes is less than or equal to the threshold set value $I_{max0}$, a fixed value $K_{set}$ of the resistive coefficient K is determined.

Finally, until a value of the resistive coefficient K corresponding to the phase current amplitudes of the each phase current, differential determination is performed in conjunction with the differential current $I_{cd}$ and the resistive current $I_{res}$ in the each phase current and the obtained value of the resistive coefficient K corresponding to the phase current amplitudes of the each phase current and using a following formula:

$$\begin{cases} I_{cd} > I_{set} \\ I_{cd} > KI_{res} \end{cases}.$$

In the above formula, $I_{set}$ is a current setting value, and if the differential current $I_{cd}$ of the target phase satisfies the above formula for differential determination, it is determined that a fault occurs in an area of the target phase.

If the differential current $I_{cd}$ of the target phase fails to satisfy the above formula for differential determination, it is determined that no fault occurs in the area of the target phase.

Based on the above determination method, the value of the resistive coefficient K can be selected automatically according to the fault condition, where the resistive coefficient K is smaller when the fault occurs in the area, and the resistive coefficient K is larger when the fault occurs outside the area, thereby improving the sensitivity in an area of the electricity transmission line with multi-terminal T-connection and improving the reliability of the resistive characteristic outside the area at the same time.

Figure 2:
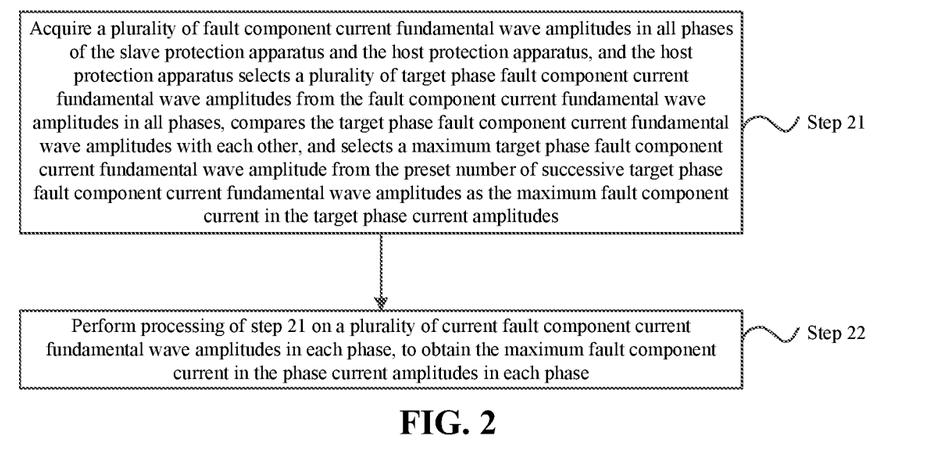
FIG. 2 is a flowchart of a maximum fault component current $\Delta \dot{I}_{max}$ in phase current amplitudes of each phase current according to the present application.

In an embodiment, as shown in FIG. 2, the step of obtaining the maximum fault component current $\Delta \dot{I}_{max}$ in the phase current amplitudes of the each phase current includes steps 21 and 22. In step 21, a plurality of fault component current fundamental wave amplitudes in all phases of the slave protection apparatus and the host protection apparatus are acquired, and the host protection apparatus selects a plurality of target phase fault component current fundamental wave amplitudes from the fault component current fundamental wave amplitudes in all phases, compares the target phase fault component current fundamental wave amplitudes, and selects a maximum one from the preset number of successive target phase fault component current fundamental wave amplitudes as the maximum fault component current $\Delta \dot{I}_{max}$ in the target phase current amplitudes.

In step 22, processing of step 21 is performed on a plurality of current fault component current fundamental wave amplitudes in each phase, to obtain the maximum fault component current $\Delta \dot{I}_{max}$ in the phase current amplitudes in the each phase.

In the embodiment, the method for selecting the maximum fault component current $\Delta \dot{I}_{max}$ in the phase current amplitudes affects the value of the resistive coefficient K, and further affects the determination whether a fault exists in the area. According to laboratory tests, the preset number of target phase fault component current fundamental wave amplitudes in this embodiment is generally 4 to 10. In step 21, the fault component current fundamental wave amplitudes in all phases of the slave protection apparatus and the host protection apparatus are acquired, and the host protection apparatus selects the target phase fault component current fundamental wave amplitudes from the fault component current fundamental wave amplitudes in all phases, compares the target phase fault component current fundamental wave amplitudes, and selects the maximum one from four successive target phase fault component current fundamental wave amplitudes as the maximum fault component current $\Delta \dot{I}_{max}$ in the target phase current amplitudes. In step 22, the operation in step 21 is repeated until the maximum fault component current $\Delta \dot{I}_{max}$ in the phase current amplitudes of the each phase current is obtained.

In an embodiment, the step of calculating the differential current $I_{cd}$ in each phase current, the resistive current $I_{res}$ in each phase current and the vector sum $\Delta \dot{I}_{\Sigma}$ of the fault component currents except the maximum fault component current $\Delta \dot{I}_{max}$ in the phase current amplitudes of the each phase current includes following steps. All phase current amplitudes of the host protection apparatus and the slave protection apparatus are calculated according to a full-cycle Fourier algorithm, and the difference current $I_{cd}$ in each phase current is obtained using a formula 1:

$$I_{cd} = \left| \sum_{j=1}^{n} \dot{I}_j \right|. \tag{1}$$

In the above formula, $\dot{I}_j$ is an in-phase current on a j-th side of the electricity transmission line with multi-terminal T-connection, and n is a sum of the number of host protection apparatuses and the number of slave protection apparatuses.

The vector sum $\Delta \dot{I}_{\Sigma}$ of fault component currents except the maximum fault component current $\Delta \dot{I}_{max}$ in the phase current amplitudes of the each phase current is obtained using a formula 2:

$$\Delta \dot{I}_{\Sigma} = \sum_{j=1}^{n} \dot{I}_j - \Delta \dot{I}_{max}. \tag{2}$$

In the above formula, $\Delta \dot{I}_{max}$ is the maximum fault component current in the phase current amplitudes of the each phase current.

The resistive current $I_{res}$ in the each phase current is obtained using a formula 3:

$$I_{res} = |\Delta \dot{I}_{max} - \Delta \dot{I}_{\Sigma}| \tag{3}.$$

In implementation, the differential current in each phase current is obtained using the formula 1, where the differential current in each phase current is a vector sum of currents of the host protection apparatus and the slave protection apparatus in current amplitudes in the each phase; the vector sum $\Delta \dot{I}_{\Sigma}$ of fault component currents except the maximum fault component current $\Delta \dot{I}_{max}$ in each phase current is obtained using the formula 2; and the resistive current $I_{res}$ in each phase current is obtained using the formula 3, where the resistive current $I_{res}$ in the each phase current is a vector sum of the maximum fault component current $\Delta \dot{I}_{max}$ and the vector sum $\Delta \dot{I}_{\Sigma}$ of fault component currents except $\Delta \dot{I}_{max}$ in the phase current amplitudes of each phase current. The purpose of acquiring these values is determine whether a fault exists in the area of all phases.

In an embodiment, the step of determining the set value $K_{\theta}$ of the resistive coefficient K according to the undetermined phase angle difference $\theta$ includes substituting the undetermined phase angle difference $\theta$ into a phase angle difference function for calculation:

$$K_\theta = \left(a\sin\frac{\theta}{2} + b\right) + K_{set}.$$

In the above function, a and b are constants, and the undetermined phase angle difference θ is within a value range of [0°, 180°]. The set value $K_\theta$ of the resistive coefficient K is determined according to a calculation result.

In implementation, the phase angle difference function is $$K_\theta = \left(a\sin\frac{\theta}{2} + b\right) + K_{set},$$

where a and b are constants, and the undetermined phase angle difference θ is within a value range of [0°, 180°]. When the maximum fault component current $\Delta\dot{I}_{max}$ in the target phase current amplitudes is less than or equal to the set threshold value $I_{max0}$, the resistive coefficient K is determined as a fixed value $K_{set}$. The fixed value $K_{set}$ in this embodiment has a value of 0.7 according to the experimental requirement. When the maximum fault component current $\Delta\dot{I}_{max}$ in the target phase current amplitudes is greater than the set threshold value $I_{max0}$, the resistive coefficient K is determined as a set value $K_\theta$, and the set value $K_\theta$ is substituted into the phase angle difference function $$K_\theta = \left(a\sin\frac{\theta}{2} + b\right) + K_{set}.$$

When a equals to 0.7 and b equals to 0.5, the phase angle difference function is $$K_\theta = \left(0.7\sin\frac{\theta}{2} + 0.5\right) + K_{set},$$

then the undetermined phase angle difference θ is determined, the value of the set value $K_\theta$ may be calculated by substituting the phase angle difference θ into $$K_\theta = \left(0.7\sin\frac{\theta}{2} + 0.5\right) + K_{set},$$

where the set value $K_\theta$ varies along with the change of the undetermined phase angle difference θ. As shown in Table 1, the determination of the relationship between the set value $K_\theta$ and the undetermined phase angle difference θ may also be quickly implemented by inquiring the table without manual calculation.

TABLE 1

| | θ/2 | | | | | | |
|---|---|---|---|---|---|---|---|
| | 0° | 5° | 10° | 15° | 20° | 25° | 30° |
| $K_\theta$ | 0.35 | 0.39 | 0.43 | 0.47 | 0.51 | 0.55 | 0.59 |
| | θ/2 | | | | | | |
| | 35° | 40° | 45° | 50° | 55° | 60° | 65° |
| $K_\theta$ | 0.63 | 0.66 | 0.69 | 0.72 | 0.75 | 0.77 | 0.79 |

TABLE 1-continued

| | θ/2 | | | | |
|---|---|---|---|---|---|
| | 70° | 75° | 80° | 85° | 90° |
| $K_\theta$ | 0.81 | 0.82 | 0.82 | 0.83 | 0.84 |

In an embodiment, the phase angle difference function is a monotone increasing function. When the undetermined phase angle difference θ is 0°, the set value $K_\theta$ is $K_{min}$.

When the undetermined phase angle difference θ is 180°, the set value $K_\theta$ is $K_{max}$.

The set value $K_\theta$ satisfies: $0 < K_{min} < K_\theta < K_{max} < 1$.

In implementation, the phase angle difference function is a monotone increasing function. The set value $K_\theta$ increases along with the increase of the undetermined phase angle difference θ. According to the above, the fixed value $K_{set}$ has a value of 0.7, when a fault occurs in a target area, the undetermined phase angle difference θ is determined to be 0°, and the set value $K_\theta$ is determined to be $K_{min}$ by inquiring the table, where $K_{min}$ has a value of 0.35; when a fault occurs outside the target area, the undetermined phase angle difference θ is determined to be 180°, and the set value $K_\theta$ is determined to be $K_{max}$ by inquiring the table, where $K_{max}$ has a value of 0.85; and the set value $K_\theta$ is determined to satisfies: $0 < K_{min} < K_\theta < K_{max} < 1$.

The present application provides a determination method of differential protection. The determination method is suitable for an electricity transmission line with multi-terminal T-connection and includes: sampling and calculating all phase currents, and calculating a maximum fault component current $\Delta\dot{I}_{max}$ in phase current amplitudes of each phase current, a differential current $I_{cd}$ in the each phase current, a resistive current $I_{res}$ in the each phase current and a vector sum $\Delta\dot{I}_\Sigma$ of fault component currents except $\Delta\dot{I}_{max}$ in the phase current amplitudes of the each phase current; and comparing the maximum fault component current $\Delta\dot{I}_{max}$ in phase current amplitudes of each phase current and a threshold setting value $I_{max0}$, determining a value of a resistive coefficient K corresponding to the phase current amplitudes of the each phase current according to a comparison result, and performing differential determination on the differential current $I_{cd}$ and the resistive current $I_{res}$ in phase current amplitudes of the each phase current according to a differential determination formula: if the differential current $I_{cd}$ of the target phase satisfies the above differential determination formula, it is determined that a fault occurs in an area of the target phase. Through the determination method, the values of the resistive coefficient K can be automatically selected according to the fault condition, thereby improving the sensitivity in an area of the electricity transmission line with multi-terminal T-connection and improving the reliability of the resistive characteristic outside the area at the same time.

The serial numbers in the above embodiments are merely for ease of description and do not indicate superiority and inferiority of the embodiments.

What is claimed is:

1. A determination method of differential protection, wherein the determination method is suitable for an electricity transmission line with multi-terminal T-connection, the electricity transmission line with multi-terminal T-connection comprises a host protection apparatus and a slave protection apparatus, the host protection apparatus is connected to a terminal of the electricity transmission line with multi-terminal T-connection, the slave protection apparatus is connected to remaining terminals of the electricity transmission line with multi-terminal T-connection, wherein the determination method comprises:

step 1: respectively sampling a plurality of phase currents of the host protection apparatus and a plurality of phase currents of the slave protection apparatus, and transmitting a plurality of phase current amplitudes sampled from the plurality of phase currents of the slave protection apparatus to the host protection apparatus;

step 2: calculating, by the host protection apparatus, all phase current amplitudes sampled from the plurality of phase currents of the slave protection apparatus and the plurality of phase currents of the host protection apparatus, obtaining a maximum fault component current $\Delta \dot{I}_{max}$ in a plurality of phase current amplitudes of each phase current of all phase currents, and calculating a differential current $I_{cd}$ in the each phase current, a resistive current $I_{res}$ in the each phase current and a vector sum $\Delta \dot{I}_\Sigma$ of one or more fault component currents except the maximum fault component current $\Delta \dot{I}_{max}$ in the phase current amplitudes of the each phase current;

step 3: selecting a plurality of target phase current amplitudes from all sampled phase current amplitudes, and in response to determining that the maximum fault component current $\Delta \dot{I}_{max}$ in the target phase current amplitudes is greater than a set threshold value $I_{max0}$, determining a target phase angle difference $\theta_1$ between a phase angle of the maximum fault component current $\Delta \dot{I}_{max}$ in the target phase current amplitudes and a phase angle of the vector sum $\Delta \dot{I}_\Sigma$ of the fault component currents except the maximum fault component current $\Delta \dot{I}_{max}$ in the target phase current amplitudes, wherein the target phase angle difference $\theta_1$ is used for assignment of a resistive coefficient K; and determining a set value $K_\theta$ of the resistive coefficient K according to an undetermined phase angle difference $\theta$, or in response to determining that the maximum fault component current $\Delta \dot{I}_{max}$ in the target phase current amplitudes is less than or equal to the threshold set value $I_{max0}$, determining a fixed value $K_{set}$ of the resistive coefficient K;

step 4: performing processing of step 3 on the phase current amplitudes of the each phase current of all phase currents, to obtain a value of the resistive coefficient K corresponding to the phase current amplitudes of the each phase current; and step 5: performing differential determination according to the differential current $I_{cd}$ in each phase current, the resistive current $I_{res}$ in the each phase current and the value of the resistive coefficient K corresponding to the each phase current amplitude obtained in step 4 and using a following differential determination formula:

$$\begin{cases} I_{cd} > I_{set} \\ I_{cd} > KI_{res} \end{cases}$$

wherein $I_{set}$ is a setting current value, and wherein in response to determining that the differential current $I_{cd}$ of the target phase satisfies the differential determination formula, a fault is determined to occur in an area of the target phase.

2. The method of claim 1, wherein obtaining the maximum fault component current $\Delta \dot{I}_{max}$ in the phase current amplitudes of the each phase current comprises:

step 21: acquiring a plurality of fault component current fundamental wave amplitudes in all phases of the slave protection apparatus and the host protection apparatus, selecting, by the host protection apparatus, a plurality of target phase fault component current fundamental wave amplitudes from the fault component current fundamental wave amplitudes in all phases, comparing, by the host protection apparatus, the target phase fault component current fundamental wave amplitudes with each other, and selecting a maximum target phase fault component current fundamental wave amplitude from a preset number of successive target phase fault component current fundamental wave amplitudes as the maximum fault component current $\Delta \dot{I}_{max}$ in the target phase current amplitudes; and step 22: performing processing of step 21 on a plurality of current fault component current fundamental wave amplitudes in each phase, to obtain the maximum fault component current $\Delta \dot{I}_{max}$ in the phase current amplitudes in the each phase.

3. The method of claim 1, wherein calculating the differential current $I_{nd}$ in the each phase current, the resistive current Ires in the each phase current and the vector sum AIy of the fault component currents except the maximum fault component current AIma$_x$ in the phase current amplitudes of the each phase current comprises: calculating all phase current amplitudes of the host protection apparatus and the slave protection apparatus according to a full-cycle Fourier algorithm, and obtaining the difference current $I_{nd}$ in the each phase current using a formula 1:

$$I_{cd} = \left| \sum_{j=1}^{n} \dot{i}_j \right| \quad (1)$$

wherein I is an in-phase current on a j-th side of the electricity transmission line with multi-terminal T-connection, and n is a sum of a number of host protection apparatuses and a number of slave protection apparatuses; obtaining the vector sum AIy of fault component currents except the maximum fault component current AIma$_x$ in the each phase current using a formula 2:

$$\Delta \dot{i}_\Sigma = \sum_{j=1}^{n} \dot{i}_j - \Delta \dot{i}_{max} \quad (2)$$

wherein AIma$_x$ is the maximum fault component current in the phase current amplitudes of the each phase current; and obtaining the resistive current Ies in the each phase current using a formula 3:

$$I_{res} = |\Delta \dot{i}_{max} - \Delta \dot{i}_\Sigma| \quad (3).$$

4. The method of claim 1, wherein determining the set value $K_\theta$ of the resistive coefficient K according to the undetermined phase angle difference $\theta$ comprises:

substituting the undetermined phase angle difference $\theta$ into a phase angle difference function for calculation:

$$K_\theta = \left( a \sin \frac{\theta}{2} + b \right) + K_{set}$$

wherein a and b are constants, and the undetermined phase angle difference θ is within a value range of [0°, 180°]; and determining the set value $K_\theta$ of the resistive coefficient K according to a calculation result.

5. The method of claim 4, wherein the phase angle difference function is a monotone increasing function, wherein in response to determining that the undetermined phase angle difference θ is 0°, the set value $K_\theta$ of the resistive coefficient K is $K_{min}$; and in response to determining that the undetermined phase angle difference θ is 180°, the set value $K_\theta$ of the resistive coefficient K is $K_{max}$;

wherein the set value $K_\theta$ of the resistive coefficient K is: $0 < K_{min} < K_\theta < K_{max} < 1$.

\* \* \* \* \*

UNITED STATES PATENT AND TRADEMARK OFFICE
CERTIFICATE OF CORRECTION

PATENT NO. : 11,764,568 B2
APPLICATION NO. : 16/761022
DATED : September 19, 2023
INVENTOR(S) : Ping Zhao et al.

It is certified that error appears in the above-identified patent and that said Letters Patent is hereby corrected as shown below:

In the Claims

Claim 3, Column 10, Line 22:
current $I_{nd}$ in the each phase current, the resistive
Should read -- current $I_{cd}$ in the each phase current, the resistive --

Claim 3, Column 10, Line 23:
current Ires in the each phase current and the vector sum AIy;
Should read -- current $I_{res}$ in the each phase current and the vector sum $\Delta \dot{I}_\Sigma$ --

Claim 3, Column 10, Line 25:
component current AIma$_x$ in the phase current amplitudes of
Should read -- component current $\Delta \dot{I}_{max}$ in the phase current amplitudes of --

Claim 3, Column 10, Line 29:
and obtaining the difference current $I_{nd}$ in the
Should read -- and obtaining the difference current $I_{cd}$ in the --

Claim 3, Column 10, Line 37:
wherein I is an in-phase current on a j-th side of the
Should read -- wherein $\dot{I}_j$ is an in-phase current on a j-th side of the --

Claim 3, Column 10, Line 41:
obtaining the vector sum AIy of fault component currents
Should read -- obtaining the vector sum $\Delta \dot{I}_\Sigma$ of fault component currents --

Claim 3, Column 10, Line 42:
except the maximum fault component current AIma$_x$ in the;
Should read -- except the maximum fault component current $\Delta \dot{I}_{max}$ in the --

Signed and Sealed this
Fifth Day of December, 2023

Katherine Kelly Vidal
*Director of the United States Patent and Trademark Office*

Claim 3, Column 10, Line 51:
wherein AImax is the maximum fault component current in
Should read -- wherein $\Delta\dot{I}_{\max}$ is the maximum fault component current in the --

Claim 3, Column 10, Line 53:
obtaining the resistive current Ies in the each phase current
Should read -- obtaining the resistive current $I_{res}$ in the each phase current --